United States Patent
Kondo et al.

(10) Patent No.: US 6,593,520 B2
(45) Date of Patent: Jul. 15, 2003

(54) SOLAR POWER GENERATION APPARATUS AND CONTROL METHOD THEREFOR

(75) Inventors: Hiroshi Kondo, Nara (JP); Naoki Manabe, Ibaraki (JP); Nobuyoshi Takehara, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/791,588

(22) Filed: Feb. 26, 2001

(65) Prior Publication Data

US 2001/0023703 A1 Sep. 27, 2001

(30) Foreign Application Priority Data

Feb. 29, 2000 (JP) ........................................ 2000-053609

(51) Int. Cl.⁷ ............................................. H01L 31/042
(52) U.S. Cl. ...................... 136/244; 136/291; 136/293; 363/50; 323/906
(58) Field of Search ............................ 361/42, 20, 115; 136/293, 291, 244; 363/50; 323/906

(56) References Cited

U.S. PATENT DOCUMENTS

| 5,235,232 A | * | 8/1993 | Conley et al. .............. 310/303 |
| 5,751,524 A | * | 5/1998 | Swindler ..................... 361/42 |
| 6,093,885 A | | 7/2000 | Takehara et al. ............ 136/244 |
| 6,101,073 A | * | 8/2000 | Takehara ..................... 361/42 |

FOREIGN PATENT DOCUMENTS

| JP | 57-119680 | 7/1982 |
| JP | 61-18423 | 5/1986 |

OTHER PUBLICATIONS

Trace Engineering. "Model PVGFP" product brochure. Feb. 1999.*
Article 690–5 of the National Electrical Code®.*
Wiles, John C. "Photovoltaic Saftey Equipment and the National Electrical Code®" Photovoltaic Specialists Conference, 1991., Conference Record of the Twenty Second IEEE , 1991. pp. 652–657 vol. 1.*

* cited by examiner

Primary Examiner—Nam Nguyen
Assistant Examiner—Brian L Mutschler
(74) Attorney, Agent, or Firm—Fitzpatrick, Cella, Harper & Scinto

(57) ABSTRACT

When a ground fault occurs in some solar battery string, this solar battery string may be disconnected and operation of a solar power generation system may be continued. If the open-circuit voltage of the solar battery string is high, a safety problem arises. If the open-circuit voltage is decreased, the conversion efficiency decreases. Therefore, an intermediate switch is provided midway along the solar battery string. When a ground fault occurs, this solar battery string where the ground fault has occurred is divided into substrings.

5 Claims, 8 Drawing Sheets

SOLAR POWER GENERATION APPARATUS AND CONTROL METHOD THEREFOR

FIELD OF THE INVENTION

The present invention relates to a solar power generation apparatus and a control method therefor and, more particularly, to a solar power generation apparatus with a solar battery array comprised of a solar battery string formed by a plurality of series-connected solar panels.

BACKGROUND OF THE INVENTION

In recent years, as the power demand increases, solar power generation systems spread, which serve to compliment a large-scale power plant and can be interconnected to a commercial power system. Currently, to operate a system interconnection solar power generation system, its safety must always be strictly ensured. When the power generation system is not to be interconnected to the commercial power system but is to be used independently, it is also preferable that its safety be always strictly ensured. In order to make the solar power generation system more popular for homes in the future, power must be supplied to the user stably in a particularly safe state without letting the user aware of it, and a system having such a function is required.

FIG. 7 is a view showing an example of a solar power generation system. This system is comprised of a solar battery array 101 as a DC power supply, a collector box 102 for collecting an output from the solar battery array 101, a power conditioner 103 serving as a power converter, and a load 104. The power conditioner 103 has an inverter 106 with un-isolated input/output terminals, and an interconnection protecting relay 107.

The solar battery array 101 may be appropriately formed so that it can obtain an output voltage necessary as a solar power generation system. In a private home-use 3-kw output solar power generation system interconnected to single-phase 200 V, considering the conversion efficiency of the power conditioner 103 and the maximum open-circuit voltage, the solar battery array 101 is preferably formed such that the input voltage (operation voltage) of the power conditioner 103 becomes approximately 200 V. In the arrangement shown in FIG. 7, when an abnormality occurs in the solar battery array 101 or on the electrical path from the solar battery array 101 to the power conditioner 103, the operation of the inverter 106 is stopped and the interconnection protecting relay 107 is opened.

Japanese Patent Publication No. 61-18423 discloses an arrangement in which when a power conditioner 103 is stopped, an output from an solar battery array 101 is short-circuited, as shown in FIG. 8. With the arrangement of FIG. 8, when a ground fault abnormality of the solar battery array 101 is detected, a ground fault switch 111 is closed, so that the output voltage from the solar battery array 101 can be set to 0 V. In the arrangement shown in FIG. 7, even if an abnormality such as a ground fault occurs and the operation of the power conditioner 103 is stopped, the solar battery array 101 keeps generating, as the output voltage, an open-circuit voltage corresponding to the number of solar battery strings (the number of series-connected solar panels) until a person in charge of repair fixes the abnormality.

It is also possible to form a solar power generation system by setting in advance the output voltage from the solar battery strings to a low voltage, in other words, by suppressing the number of strings. In this case, if the system is to be interconnected to a 200-V system, the step-up ratio of the power conditioner 103 increases, and accordingly the conversion efficiency degrades.

In the arrangement of FIG. 7, even when an abnormality occurs in one string, the operation of the entire solar power generation system must be stopped. This applies to the arrangement of FIG. 8, that is, the entire system must be stopped when an abnormality occurs.

When a cable connecting the solar battery array 101 and collector box 102 is damaged to cause a ground fault, the short-circuit current continues to flow to the damaged cable portion to overheat it.

SUMMARY OF THE INVENTION

The present invention has been made to solve the above problems separately or altogether, and has as its object to ensure the safety of a solar power generation system without degrading a conversion efficiency.

In order to achieve this object, according to the present invention, there is provided a solar power generation apparatus that comprises a solar battery string which is formed by a plurality of series-connected solar panels, a detector for outputting an abnormality detection signal upon detection of a ground fault in the solar battery string, and at least one switch which is provided midway along the solar battery string and shifted to an open state by the abnormality detection signal.

It is another object of the present invention to eliminate the necessity for stopping the operation of the entire solar power generation system when short circuiting occurs in part of a solar battery array.

In order to achieve this object, according to the present invention, there is provided a solar power generation apparatus comprising a plurality of solar battery strings each of which is formed by a plurality of series-connected solar panels, wherein the plurality of solar battery strings are parallel connected a plurality of detectors for detecting a ground fault in units of the plurality of solar battery strings, wherein the detectors output an abnormality detection signal upon detection of a ground fault, and a first switch for each solar battery string which is provided midway along each solar battery string, wherein the first switch corresponding to one of the solar battery strings is shifted to an open state by the abnormality detection signal associated with the one of the solar battery strings. A second switch is provided for each of the solar battery strings to disconnect the solar battery string from remaining ones of the solar battery strings, wherein the second switch is shifted to an open state by the abnormality detection signal generated by a corresponding one of the detectors.

It is still another object of the present invention to prevent, when a cable connecting a solar battery array and a collector box is severely damaged, the damaged portion from overheating.

In order to achieve this object, according to the present invention, there is provided a control method of a solar power generation apparatus having a solar battery string formed by a plurality of series-connected solar panels, and at least one switch provided midway along the solar battery string and shifted to an open state by an abnormality detection signal, comprising the step of shifting the at least one switch corresponding to the solar battery string where a ground fault has occurred to an open state when a ground fault in the solar battery string is detected.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

According to an embodiment of the present invention, a solar battery string may be disconnected from a solar power generation system in advance before an intermediate switch (to be described later) is opened/closed, and the intermediate switch may be opened/closed while no current flows through it. With this arrangement, a switch with a low current breaking ability can be used as the intermediate switch.

According to another embodiment of the present invention, a collector box of a solar power generation apparatus may have a solar battery string formed by a plurality of series-connected solar panels, and a plurality of intermediate switches (to be described later) provided midway along the solar battery string. These plurality of intermediate switches may be manually or automatically opened/closed simultaneously. With this arrangement, when an abnormality occurs in a solar battery array, the plurality of intermediate switches provided midway along the abnormal solar battery string are opened simultaneously, so no intermediate switch can be erroneously left ON, and the solar battery string can be divided into substrings reliably and safely. Also, when the intermediate switches are to be turned on, the plurality of intermediate switches can be closed simultaneously, and no intermediate switch can be erroneously left OFF.

First Embodiment

Figure 1:
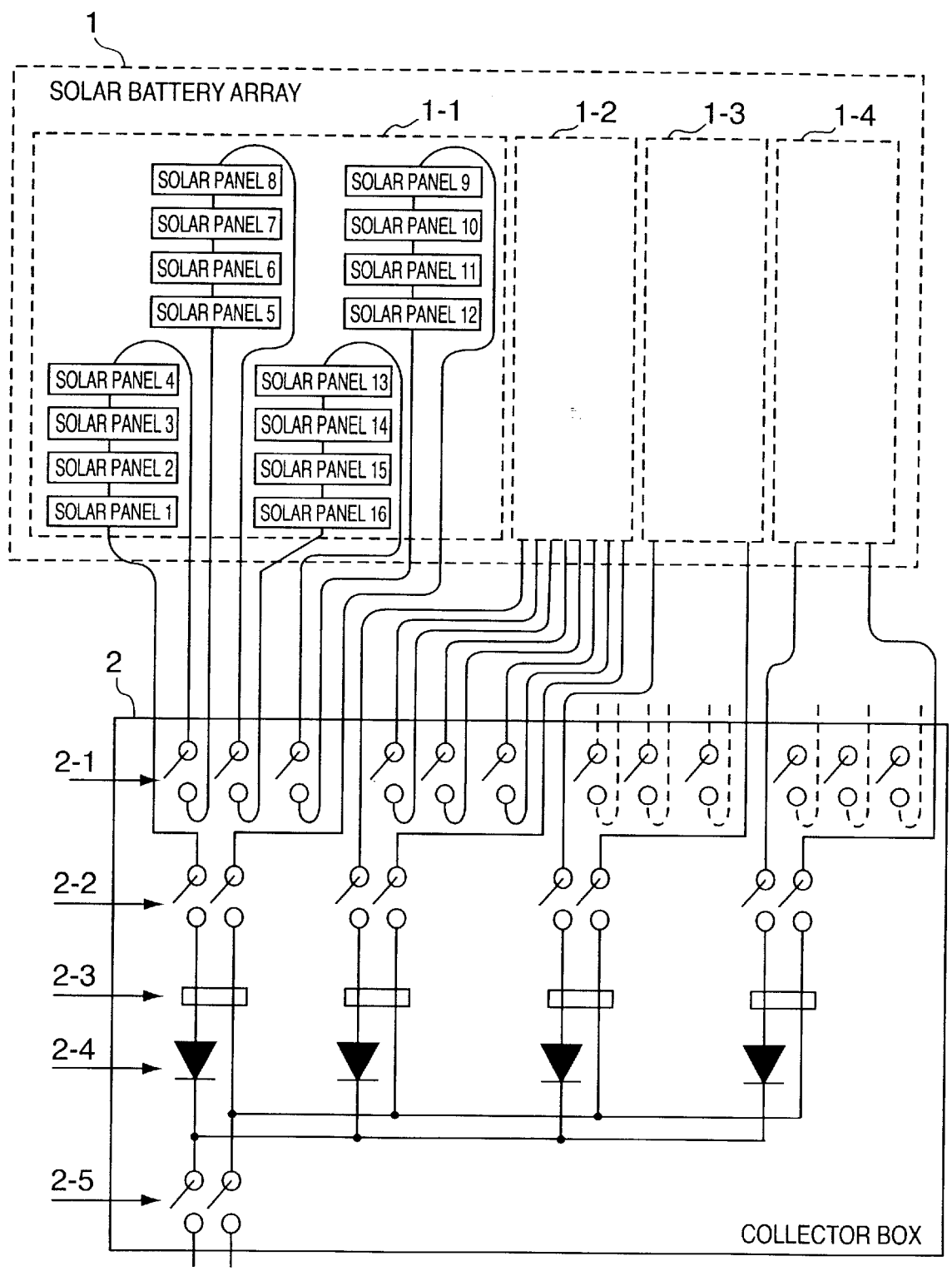
FIG. 1 is a view showing a solar battery array and collector box according to the first embodiment.
Figure 2:
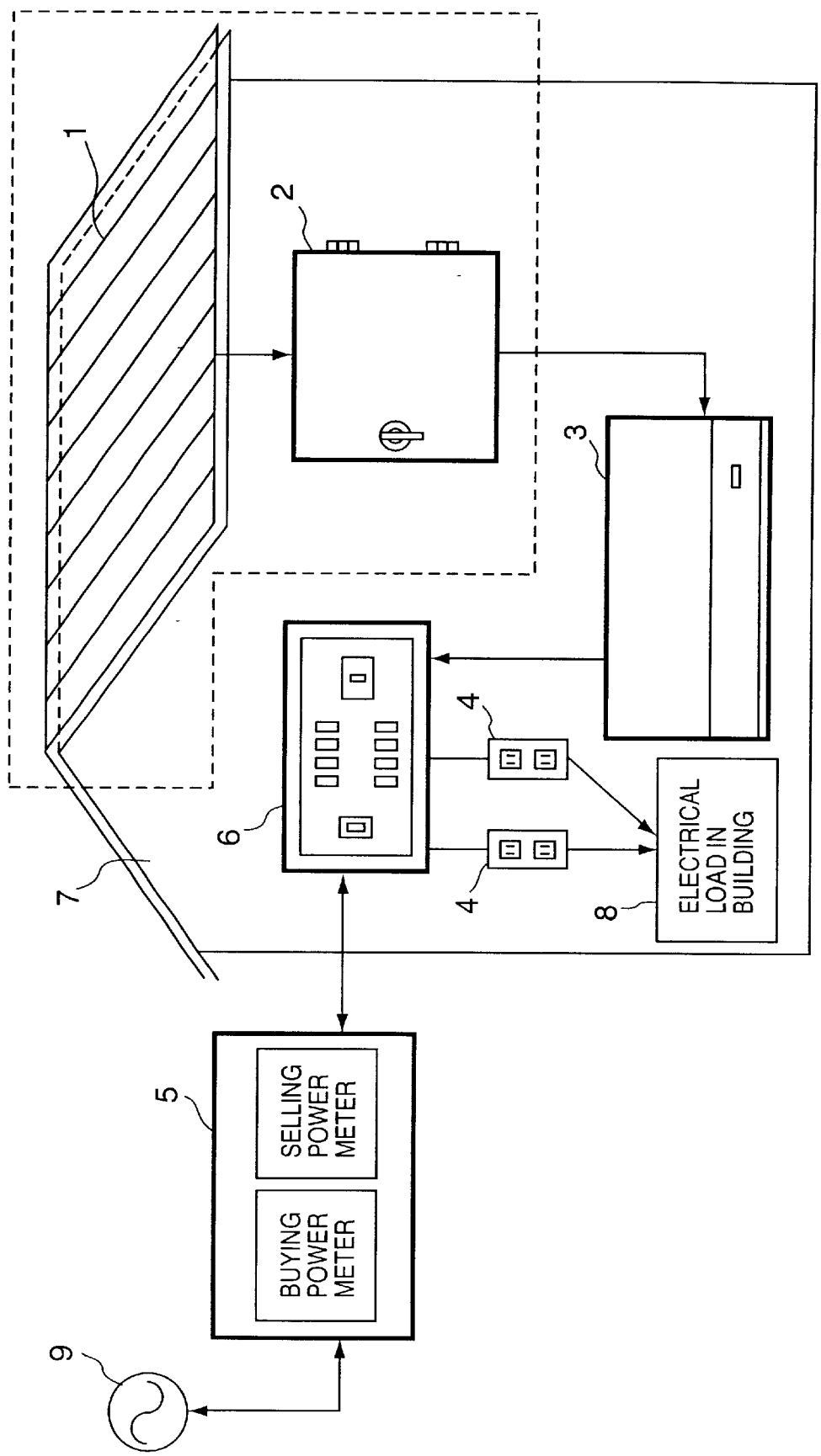
FIG. 2 is a view showing a solar power generation system employing the solar battery array and collector box shown in FIG. 1, and a building where this system is installed.

The first embodiment of the present invention will be described with reference to FIGS. 1 and 2. FIG. 2 is a schematic view of a solar power generation system using a collector box according to the first embodiment. FIG. 1 is a view showing in detail a solar battery array 1 surrounded by a broken line in FIG. 2 and a collector box 2 adopted by the first embodiment. The solar power generation system according to the first embodiment is comprised of the solar battery array 1, the collector box 2, a power conditioner 3, outlets 4 for supplying power to loads, a selling/buying power meter box 5, a switchboard 6, and the like. The constituent elements in FIGS. 1 and 2 will be described in the following order.

Main Constituent Elements

Solar Battery Array 1

The solar battery array 1 is formed by a plurality of parallel-connected solar battery strings 1-1, 1-2, 1-3, and 1-4 each formed by a plurality of series-connected solar panels. As each solar panel, one with a photoelectric converter made of amorphous silicon, polysilicon, crystalline silicon, or the like is suitably used. The number of series-connected solar panels may be appropriately determined so that a voltage necessary as a solar power generation system can be obtained. Usually, when a solar power generation system for a private house is to be interconnected to a 200-V commercial power system, the solar battery strings are preferably formed such that it can output a voltage of approximately 200 V.

Solar Battery Strings 1-1 to 1-4

The solar battery array 1 is formed by the four parallel-connected solar battery strings 1-1, 1-2, 1-3, and 1-4 having the same arrangements. Each of the solar battery strings 1-1, 1-2, 1-3, and 1-4 is comprised of four sets of substrings with each set being made up of four panels, as will be described later in detail, and is formed of a total of 16 series-connected solar panels. In FIG. 1, the arrangement of each of the solar battery strings 1-2 to 1-4 is the same as that of the solar battery string 1-1, and accordingly solar panels 1 to 16 are not shown.

Collector Box 2

Outputs from the solar battery strings 1-1 to 1-4 constituting the solar battery array 1 are collected by the collector box 2. The collector box 2 is installed at such a location that the user or a person in charge of inspection can inspect it. The collector box 2 houses intermediate switches 2-1, string switches 2-2, ground fault abnormality detectors 2-3, reverse flow preventive diodes 2-4, main switches 2-5, and the like that are to be described later in detail.

Intermediate Switch 2-1

Each solar battery string is divided into a plurality of substrings, and the intermediate switches 2-1 are arranged between the substrings. As the intermediate switches 2-1 according to the first embodiment, those each having a remote-controllable input terminal so they can be tripped by an external signal are used. These intermediate switches 2-1 can be opened by an external trip signal or manually, and is turned on manually. The intermediate switches 2-1 according to the first embodiment must be able to carry and break the maximum current the solar battery strings can supply.

String Switch 2-2

The string switches 2-2 are provided in units of solar battery strings 1-1 to 1-4. As the string switches 2-2, those each having a remote-controllable input terminal so they can be tripped by an external signal are used. The string switches 2-2 can be opened by an external trip signal or manually, and is turned on manually. The string switches 2-2 are provided in order to disconnect a malfunctioning string from the circuit when maintenance and inspection of the solar battery strings 1-1 to 1-4 are to be performed, or when some solar battery panel malfunctions. The string switches 2-2 of the first embodiment must be able to carry and break the maximum current the solar battery strings can supply.

Ground Fault Abnormality Detector 2-3

The ground fault abnormality detectors 2-3 are provided in units of solar battery strings 1-1 to 1-4. Each ground fault abnormality detector 2-3 is a clamp type current sensor clamped between two, positive and negative cables, and detects the amount of difference between currents flowing through the two cables. Each of these current sensors measures the current without disconnecting the power cable and converts it into a voltage. As the ground fault abnormality detector 2-3 of the first embodiment, one that outputs an abnormality detection signal when the differential current is equal to a predetermined value or more was used.

Reverse Flow Preventive Diode 2-4

The reverse flow preventive diodes 2-4 are provided in units of solar battery strings 1-1 to 1-4. A solar battery hardly generates power when it is in the shadow of a building 7 or the like. The solar battery array 1 is formed as a parallel circuit of the solar battery strings 1-1 to 1-4. When output voltages from the solar battery strings 1-1 to 1-4 do not coincide with each other and this voltage uncoincidence is equal to a predetermined value or more, a current flows to a string in the shadow from other strings, and a current in a reverse direction to the original direction flows there. In order to prevent this reverse current, the reverse flow preventive diodes 2-4 are provided in units of solar battery strings 1-1 to 1-4.

Main Switch 2-5

The main switches 2-5 are inserted midway along a circuit that connects the collected outputs from the solar battery strings 1-1 to 1-4 to the power conditioner 3. The main switches 2-5 are used to disconnect power supply from the solar battery to the power conditioner 3 when an abnormality occurs in the power conditioner 3 or when the power conditioner 3 is to be inspected. The main switches 2-5 must be one that satisfies the maximum voltage of the entire solar battery array 1 and can be opened/closed with the maximum current.

Power Conditioner 3

An output from the solar battery array 1 is collected by the collector box 2 and is guided to the power conditioner 3. The power conditioner 3 converts the DC power of the solar battery into an AC power. An output from the power conditioner 3 is consumed by the loads.

Load

In the system interconnection solar power generation system, the load can be a combination of a commercial power system 9 and other electrical loads. In the first embodiment, each load is a combination of the commercial power system 9 and an electrical load 8 in the building 7.

System Connection

Connection of the above constituent elements according to the first embodiment will be described with reference to FIGS. 1 and 2. The building 7 mounted with the solar power generation system according to the first embodiment receives power supplied from the commercial power system 9, generates power to meet its own power demand with the solar power generation system, and supplies power to the commercial power system 9 with the reverse load flow.

The commercial power system 9 is connected to the electrical facility in the building 7 through the electrical path. The selling/buying power meter box 5 is installed between the electrical path and the building 7. A buying power meter for integrating the amount of power supplied from the electrical path to the building 7, and a selling power meter for integrating the amount of power supplied from the solar power generation system to the commercial power system 9 with the reverse load flow are connected in series to each other in the selling/buying power meter box 5.

The switchboard 6 is installed in the building 7. The electrical path connected to the building 7 is branch-connected to the indoor cables so as to supply power to the illumination instruments in the respective portions in the building 7 and to the electrical loads 8 through the outlets 4. The switchboard 6 has a master breaker for separating the commercial power system 9 and the indoor cables from each other, and branch breakers for the respective branch electrical paths. The solar power generation system and the commercial power system 9 are connected to each other through a solar power generation system interconnection breaker provided in the switchboard 6.

The outputs from the solar battery strings 1-1 to 1-4 are collected by the collector box 2. The collective output is converted by the power conditioner 3 from the DC power into the AC power. The AC power is connected to the switchboard 6.

The output from the solar battery array 1 is consumed by the electrical loads 8 in the building 7. When the amount of power generated by the solar battery array 1 exceeds the power demand in the building 7, the surplus power is sold to the commercial power system 9 through the selling/buying power meter box 5. Conversely, when the amount of power generated by the solar battery array 1 is less than the power demand in the building 7, the short power is bought from the commercial power system 9 through the selling/buying power meter box 5.

Solar Panel

As the solar panels of the first embodiment, amorphous solar panels with the following characteristics were used. The characteristics of each panel are: the voltage for the maximum-output operation is 12 V, the current for the maximum-output operation is 4 A, and the nominal output is 48 W. The open-circuit voltage for opening the output is 15 V. 16 solar panels each having the above characteristics were connected in series to form a solar battery string with a voltage of 192 V for the maximum-output operation (output: 768 W, open-circuit voltage: 240 V). The solar battery strings 1-1 to 1-4 each formed in the above manner were arranged on one roof surface of the building 7, thereby forming a solar power generation system with a maximum output of approximately 3 kW.

As shown in FIG. 1, one string is divided into four substrings, and each substring is comprised of four solar panels. The two terminals of each substring are led to the collector box 2. An intermediate switch 2-1 is inserted in the two adjacent substrings of one string.

The two terminals of each string are connected to the string switches 2-2 in the collector box 2. The electrical paths of the strings are connected to the power collecting point through the ground fault abnormality detectors 2-3 and reverse flow preventive diodes 2-4.

Operation

Figure 3:
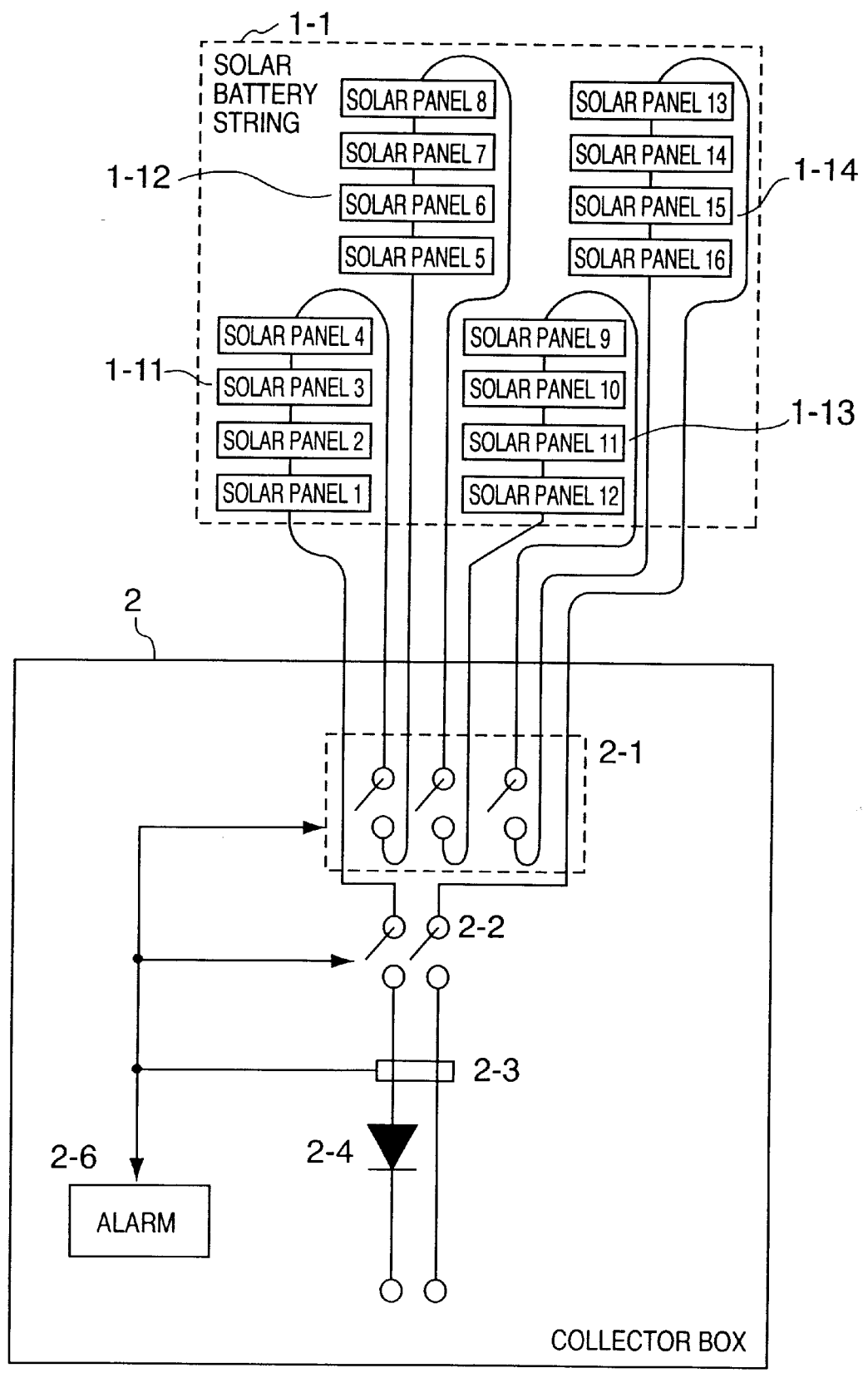
FIG. 3 is a circuit diagram showing connection between the collector box and one string according to the first embodiment.

FIG. 3 is a circuit diagram showing connection between the collector box 2 and one string. Referring to FIG. 3, the solar battery string 1-1 has a substring 1-11 comprised of solar panels 1 to 4, a substring 1-12 comprised of solar panels 5 to 8, a substring 1-13 comprised of solar panels 9 to 12, and a substring 1-14 comprised of solar panels 13 to 16. These substrings are connected in series to each other through the intermediate switches 2-1.

In this embodiment, the solar power generation system including the collector box 2 according to the first embodiment operates in the following manner.

In the arrangement shown in FIG. 3, assume that a ground fault occurs at some portion of the string 1-1. When a ground fault occurs in the electrical path of the string 1-1, the ground fault abnormality detector 2-3 in the collector box 2 provided to the electrical path of the string 1-1 outputs an abnormality detection signal. The abnormality detection signal is sent to the string switches 2-2 and intermediate switches 2-1. The string switches 2-2 and intermediate switches 2-1 are opened upon reception of the abnormality detection signal from the ground fault abnormality detector 2-3. At this time, of the four strings shown in FIG. 1, the three strings 1-2 to 1-4 continue operation in the normal manner, and the power conditioner 3 converts power generation outputs from the three strings 1-2 to 1-4 into an AC power and keeps supplying it to the loads.

When the string switches 2-2 are opened, the open-circuit voltage of the entire string 1-1 becomes 240 V. Since the intermediate switches 2-1 are also opened simultaneously, the open-circuit voltage can be suppressed to 60 V, which is equal to the open-circuit voltage of each substring.

The abnormality detection signal from the ground fault abnormality detector 2-3 is also sent to an alarm 2-6 provided in the collector box 2 and serving to generate an alarm. The alarm 2-6 informs the user that a ground fault has occurred and that a solar battery string is disconnected from the electrical path. The alarm 2-6 need not be provided to each solar battery string, and it suffices if one alarm 2-6 is provided for the solar battery array 1. From the alarm produced by the alarm 2-6, the user notices that a ground fault has occurred, and asks the builder or constructor of the solar power generation system to repair the portion where the ground fault has occurred. Even if a ground fault has occurred on the roof surface, since the intermediate switches 2-1 are opened, the open-circuit voltage of the string that has caused the ground fault is suppressed to a low voltage, so that the operator can perform operation safely. After repairing the portion where the ground fault has occurred, the operator manually closes the string switches 2-2 and intermediate switches 2-1 of the string where the ground fault has occurred, and resumes operation of the string that has been stopped.

According to the first embodiment, the open-circuit voltage 240 V of the string is decreased to 60 V. The low target voltage may be appropriately set in accordance with the environment where the solar power generation system is used and the purpose of use.

If many intermediate switches 2-1 are provided, the open-circuit voltage of the substring can be further decreased. In the first embodiment, considering the cost and space to install the intermediate switches 2-1, the open-circuit voltage of the substring was set to 60 V.

In the first embodiment, one string is equally divided into four to form substrings. Where to divide the string may be selected in accordance with the interconnection layout. Attention need be paid only to the maximum open-circuit voltage of the substring.

In the first embodiment, the ground fault abnormality detectors 2-3 are provided in the collector box 2, and outputs from the ground fault abnormality detectors 2-3 open the intermediate switches 2-1 and string switches 2-2. Alternatively, the collector box 2 may have no ground fault abnormality detectors 2-3, and the intermediate switches 2-1 and string switches 2-2 may be opened in accordance with an abnormality detection signal sent from the power conditioner 3. In this case, which one of the plurality of strings the ground fault has occurred at cannot be identified. Therefore, the intermediate switches 2-1 and string switches 2-2 of all the strings must be opened, and power generation of the entire system must be stopped.

Second Embodiment

A solar power generation system according to the second embodiment of the present invention will be described. In the second embodiment, portions identical to those of the first embodiment are denoted by the same reference numerals as in the first embodiment, and a detailed description thereof will be omitted.

Arrangement

Figure 4:
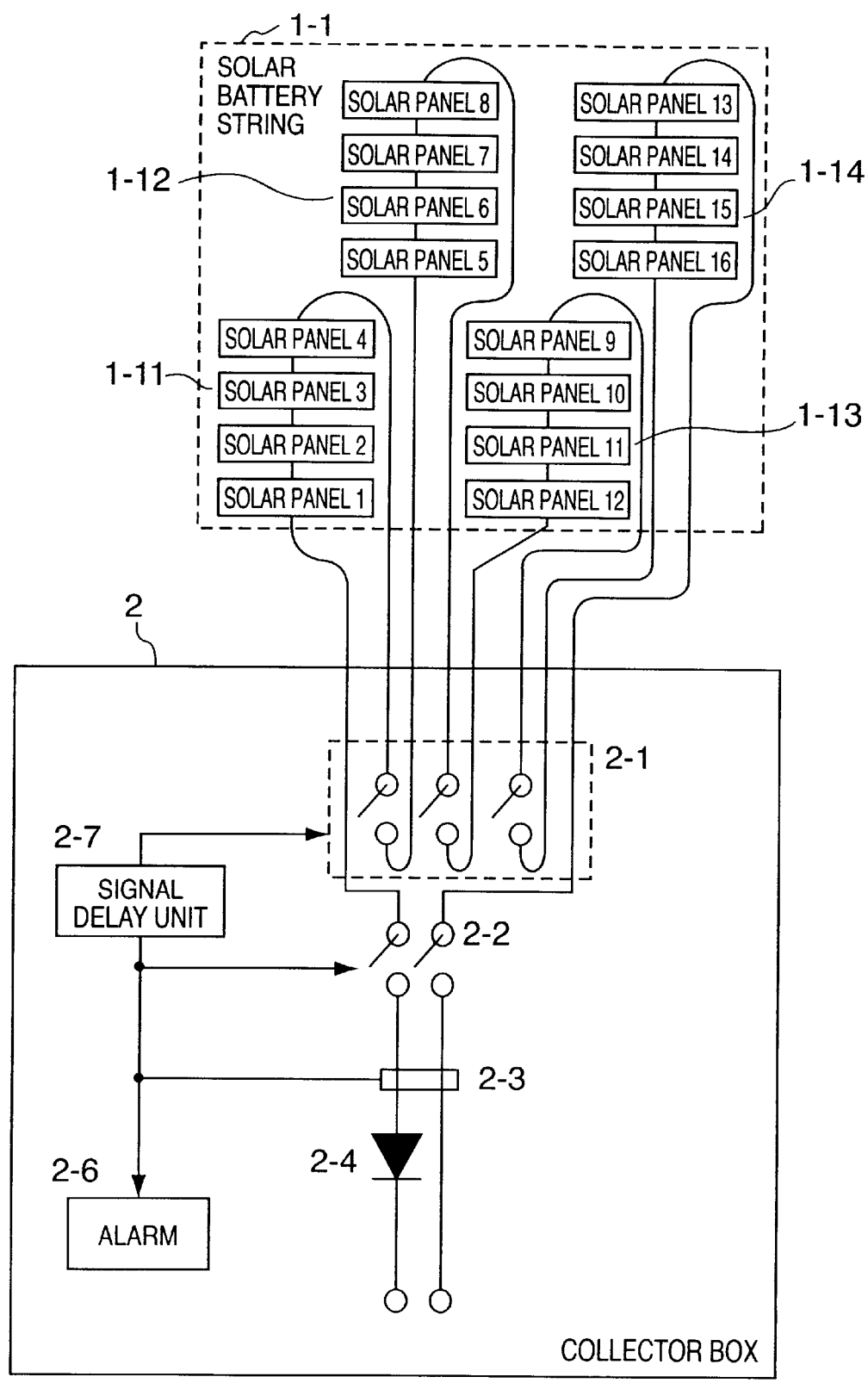
FIG. 4 is a circuit diagram showing connection between the collector box and one string according to the second embodiment.

FIG. 4 is a view showing connection between a collector box 2 and string 1-1 according to the second embodiment.

In the arrangement of the first embodiment, as the intermediate switches 2-1, switches each with a current opening/closing capacity equal to that of each string switch 2-2 are used. Because of this arrangement, when the ground fault abnormality detector 2-3 generates an abnormality detection signal, it is sent to the string switches 2-2 and intermediate switches 2-1 simultaneously to open them simultaneously. In contrast to this, the collector box 2 according to the second embodiment has a signal delay unit 2-7, so intermediate switches 2-1 are opened with a lapse of a predetermined period of time after string switches 2-2 are opened. Therefore, as the intermediate switches 2-1, switches each with a low current opening/closing capacitance can be used.

Since the intermediate switches 2-1 according to the second embodiment are always opened with the string switches 2-2 being opened, they can be switches such as disconnectors with a low current breaking ability. Note that the power carrying ability must satisfy the maximum current that can be supplied to one string. The switches are preferably turned on in the order of the intermediate switches 2-1 and then the string switches 2-2.

The signal delay unit 2-7 which outputs an abnormality detection signal with a lapse of a predetermined period of time after receiving it is provided between a ground fault abnormality detector 2-3 and the intermediate switches 2-1. The signal delay unit 2-7 may be a timer or a combination of a DIP switch and counter that can set the delay time, or a CR (a combination of a capacitor and resistor) that fixes the delay time.

Operation

The solar power generation system according to the second embodiment operates in the following manner. Assume that in the arrangement shown in FIG. 4, a ground fault has occurred at some portion of the string 1-1.

When a ground fault occurs in the electrical path of the string 1-1, the ground fault abnormality detector 2-3 provided to the string 1-1 outputs an abnormality detection signal, and this signal is sent to the string switches 2-2 and signal delay unit 2-7. The string switches 2-2 are opened upon reception of the outputs from the ground fault abnormality detectors 2-3. The signal delay unit 2-7 outputs the abnormality detection signal with a lapse of about 1 sec after receiving it. Accordingly, the intermediate switches 2-1 are opened upon reception of the abnormality detection signal from the signal delay unit 2-7 with a lapse of about 1 sec after it is output.

In this manner, since the intermediate switches 2-1 are operated with a time lag after the string switches 2-2 are opened, they can be opened while no current flows through them.

At this time, other strings 1-2 to 1-4 where the ground fault does not occur continue operation. A power conditioner 3 converts power generation outputs from the strings 1-2 to 1-4 into an AC power and continues supplying the AC power to the loads.

The open-circuit voltage of the string 1-1 where the ground fault has occurred becomes the open-circuit voltage of the entire string when the string switches 2-2 are opened. Since the intermediate switches 2-1 are also opened with a lapse of about 1 sec, which is the preset value of the signal delay unit 2-7, the open-circuit voltage of the string can be suppressed to the low open-circuit voltage of the substring.

The second embodiment can have an alarm 2-6, in the same manner as in the first embodiment. In the second embodiment, when the abnormality disappears (the ground fault is solved) and the disconnected string is to be connected to the system again, before the string switches 2-2 are turned on, the intermediate switches 2-1 must be turned on again while no current flows through it.

Third Embodiment

A solar power generation system according to the third embodiment of the present invention will be described. In the third embodiment, portions that are identical to those of the first embodiment are denoted by the same reference numerals as in the first embodiment, and a detailed description thereof will be omitted.

Arrangement

Figure 5:
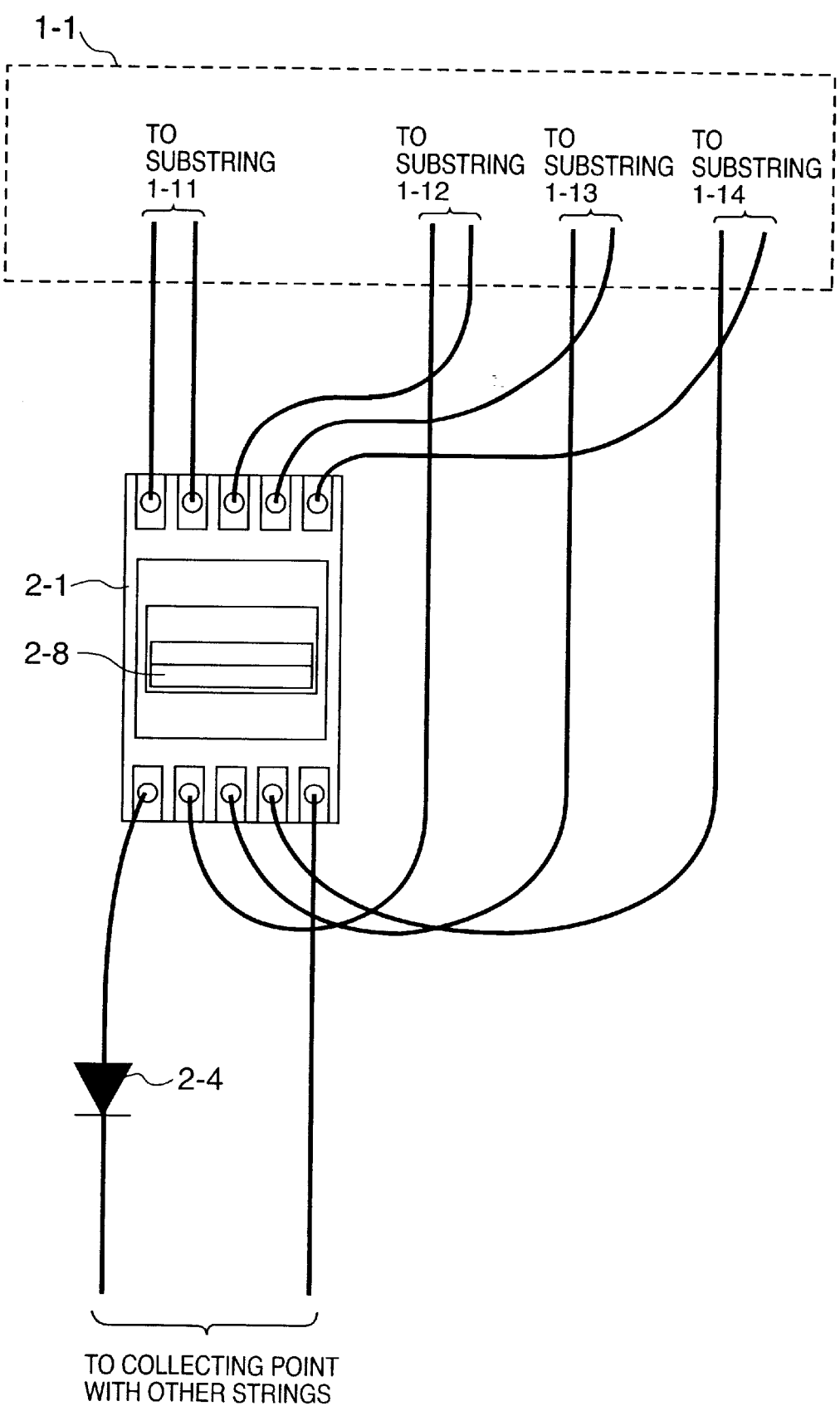
FIG. 5 is a view showing connection of intermediate switches in a collector box according to the third embodiment.
Figure 6:
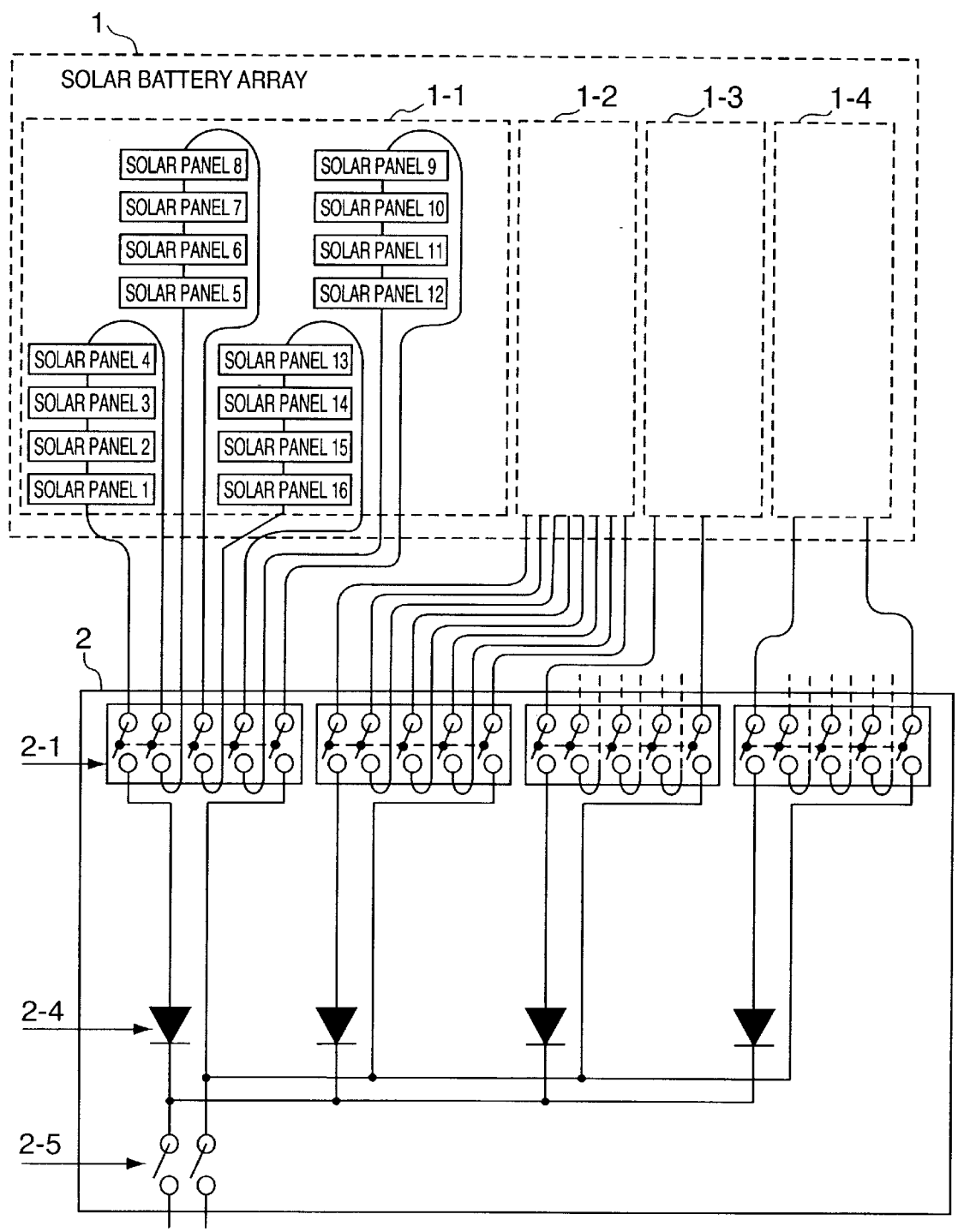
FIG. 6 is a view showing connection of the entire collector box according to the third embodiment.
Figure 7:
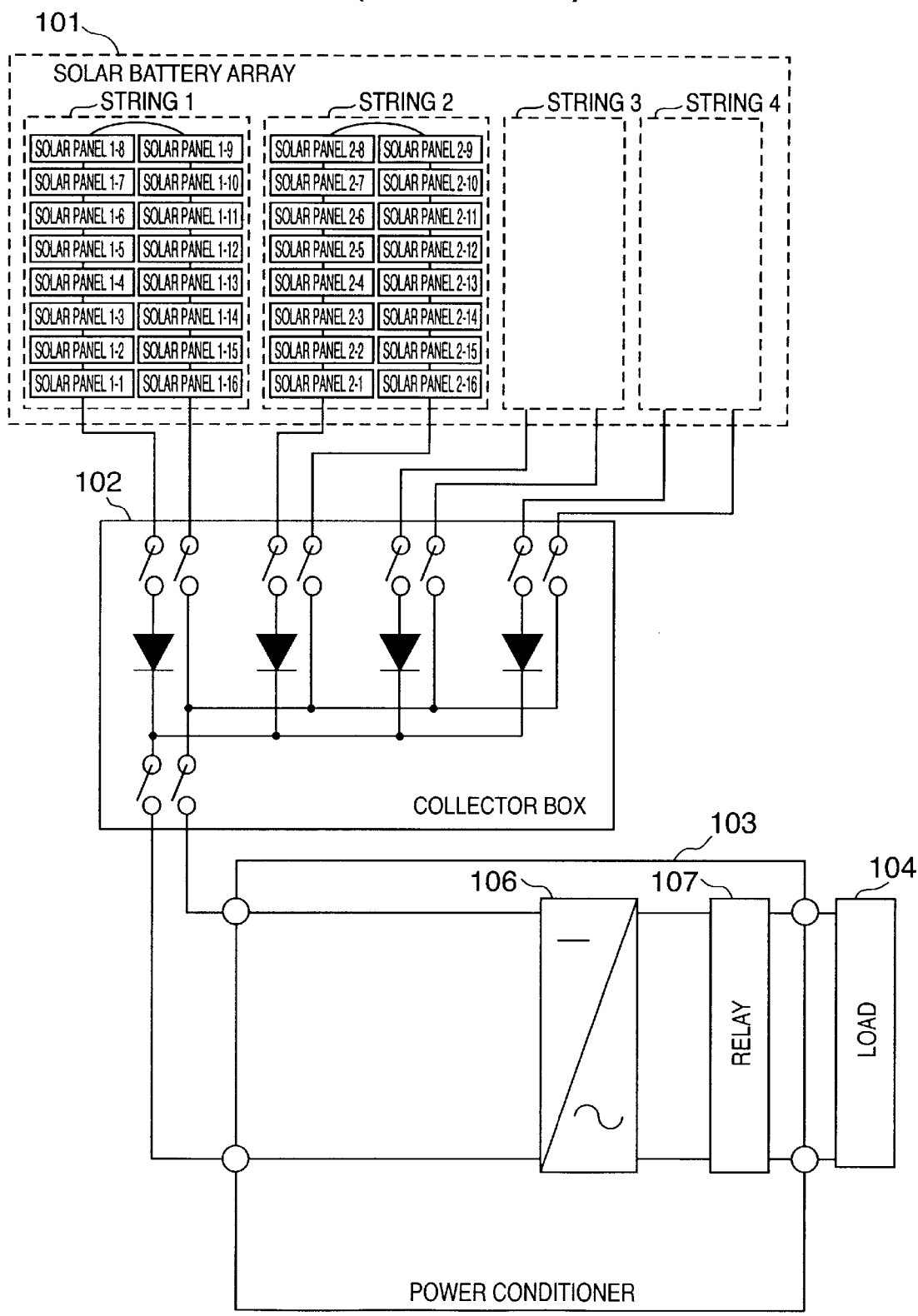
FIG. 7 is a view showing an example of a solar power generation system.
Figure 8:
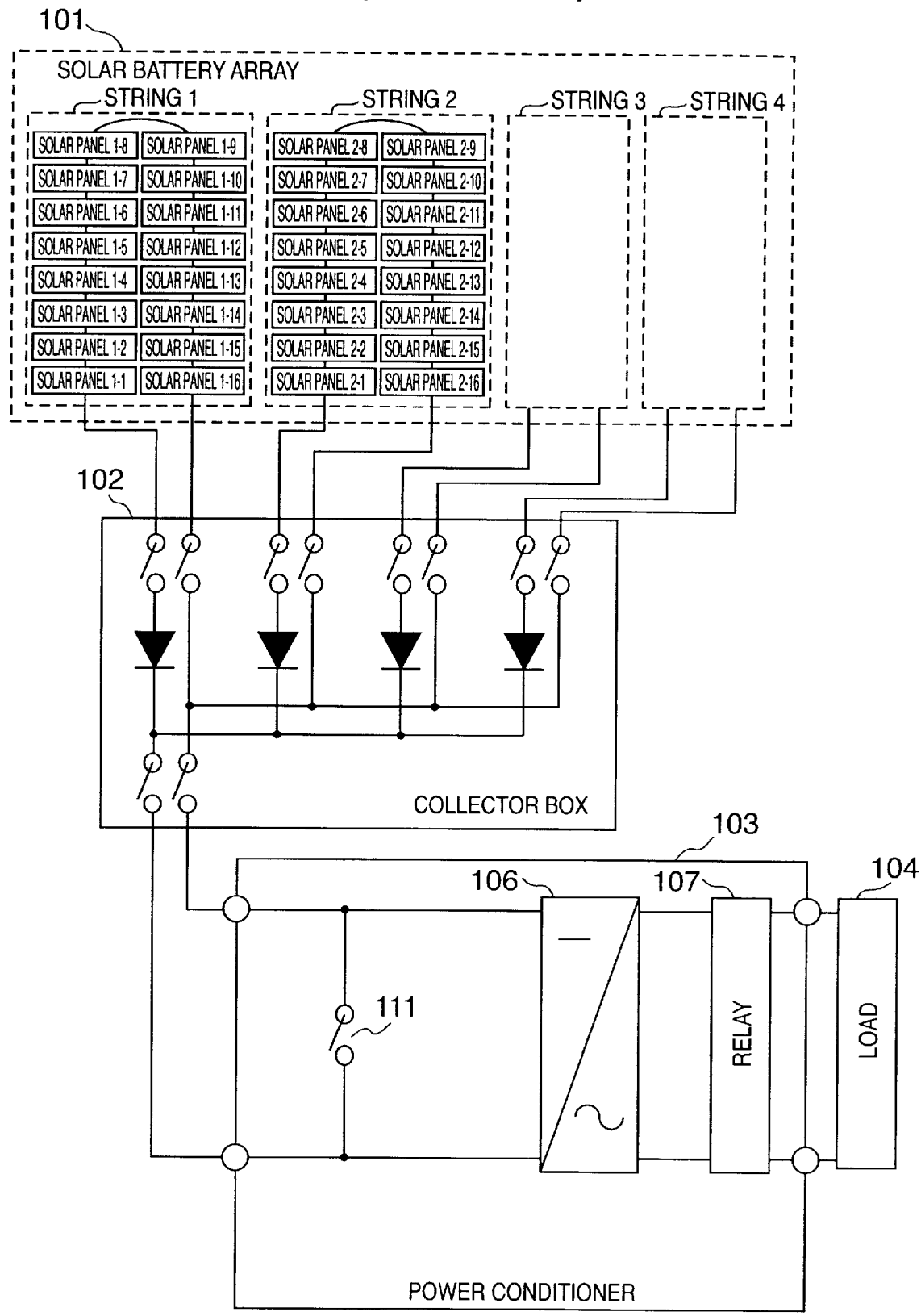
FIG. 8 is a view showing another example of the solar power generation system.

FIG. 5 is a connection view of intermediate switches 2-1 in a collector box 2 according to the third embodiment, and FIG. 6 is a connection view of the entire collector box 2 according to the third embodiment. The collector box 2 of the third embodiment has the plurality of intermediate switches 2-1 provided midway along solar battery strings 1-1 to 1-4. The intermediate switches 2-1 can be simultaneously closed/opened manually or automatically.

The intermediate switches 2-1 of the third embodiment also serve as string switches 2-2 for disconnecting the respective strings from the system. Assume that the intermediate switches 2-1 of the third embodiment are a plurality of switches that are close/opened simultaneously by one lever (e.g., lever 2-8 of FIG. 5).

The intermediate switches 2-1 may be opened/closed only manually, or both automatically and manually. In the third embodiment, the intermediate switches 2-1 can be operated only manually.

The intermediate switches 2-1 must have an ability to carry the maximum current of the string if they are operated only when main switches 2-5 are opened by interlocking, an operation instruction, or the like, but need not have an ability to break the maximum current. If the intermediate switches 2-1 are to be operated with the main switches 2-5 being turned on, i.e., in the current flowing state, they must have an ability to carry and break the maximum current that the solar battery string can supply.

Operation

The solar power generation system including the collector box 2 according to the third embodiment operates in the following manner.

Of the intermediate switches 2-1 of FIG. 5, five of them can be opened/closed simultaneously by a lever 2-8. When the intermediate switches 2-1 are opened by the lever 2-8, the string 1-1 is disconnected from the system, and simultaneously its substrings are disconnected from each other.

With this arrangement, in the third embodiment, when the lever 2-8 of the intermediate switches 2-1 is operated, a string where an abnormality has occurred can be disconnected from the system, and simultaneously the open-circuit voltage of the string disconnected from the system can be decreased to a safe level. Then, when an abnormality occurs in the solar battery array, the intermediate switches 2-1 provided midway along the abnormal string are opened, so this string is disconnected in substrings. Therefore, the intermediate switches 2-1 will not be erroneously left ON easily, and the string can be divided into substrings reliably and safely. When the intermediate switches 2-1 are to be turned on, the plurality of switches are closed simultaneously, so no switch will be erroneously left OFF easily.

In this manner, in the third embodiment as well, the open-circuit voltage of the string disconnected from the system can be decreased to a safety level, in the same manner as in the first and second embodiments.

The above embodiments have the following effects.

(1) Since the intermediate switches are provided midway along the solar battery strings, the intermediate switches of a solar battery string where an abnormality has occurred can be opened, so the open-circuit voltage of this solar battery string can be decreased to a low level.

(2) The intermediate switches can decrease the open-circuit voltage of the solar battery string where the abnormality has occurred without supplying a current to it. Therefore, even if a cable or the like is severely damaged and a ground fault occurs, a ground fault current does not keep flowing to the damaged portion, and overheating of the damaged portion can be prevented.

(3) Since the string switches can disconnect only the solar battery string where the abnormality has occurred from the solar power generation system, the operation of normal solar battery strings can be continued.

(4) During a break, the string switches are opened first, and with a time lag after that, the intermediate switches are opened. Thus, the current that can open/close the intermediate switches can be small, and the intermediate switches can be made inexpensive and compact.

(5) During installation of the solar battery array, when a cable that connects the solar battery array and the collector box is to be connected to the collector box, the intermediate switches may be opened, so this connection can be made while the open-circuit voltage of the solar battery string is low. Thus, the connecting operation need not be performed during the nighttime, or the solar battery need not be covered with a light-shielding sheet, so the operation can be performed safely and easily.

(6) When the plurality of intermediate switches provided midway along the solar battery string where the abnormality has occurred are opened simultaneously, no intermediate switch is erroneously left ON, and the solar battery string where the abnormality has occurred can be divided into substrings reliably and safely. When the plurality of intermediate switches are to be turned on, they are closed simultaneously, so that no intermediate switch can be erroneously left OFF.

As many apparently widely different embodiments of the present invention can be made without departing from the spirit and scope thereof, it is to be understood that the invention is not limited to the specific embodiments thereof except as defined in the appended claims.

What is claimed is:

1. A solar power generation apparatus comprising:

a plurality of solar battery strings each of which is formed by a plurality of series-connected solar panels, wherein the plurality of solar battery strings are parallel connected;

a plurality of detectors for detecting a ground fault in units of the plurality of solar battery strings, wherein the detectors output an abnormality detection signal upon detection of a ground fault;

a first switch for each solar battery string which is provided midway along each solar battery string, wherein the first switch corresponding to one of the solar battery strings is shifted to an open state by the abnormality detection signal associated with the one of the solar battery strings;

a second switch for each of the solar battery strings to disconnect the one of the solar battery strings from remaining ones, wherein the second switch is shifted to an open state by the abnormality detection signal generated by a corresponding one of the detectors; and a delay unit for delaying the abnormality detection signal, wherein the abnormality detection signal is supplied to the second switch directly and to the first switch through the delay unit.

2. The apparatus according to claim 1, wherein the plurality of detectors and each first switch are housed in a collector box separate from the solar battery strings.

3. The apparatus according to claim 1, wherein the first switch comprises plural switches and the plural switches can be opened or closed simultaneously.

4. The apparatus according to claim 1, further comprising an alarm for producing an alarm when the detectors output an abnormality detection signal.

5. A control method of a solar power generation apparatus which has a plurality of solar battery strings each formed by a plurality of series-connected solar panels, wherein the plurality of solar battery strings are parallel-connected, and at least one first switch provided midway along each solar battery string, and a second switch is provided for each of the solar battery strings, the control method comprising the steps of:

detecting a ground fault in a unit of the plurality of solar battery strings;

shifting the first switch of each of the solar battery strings in which the ground fault is detected to an open state; and when the ground fault in one of the solar battery strings is detected, shifting a second switch corresponding to the one of the solar battery strings for which the ground fault is detected to open state so as to disconnect the one of the solar battery strings, wherein when the ground fault in one of the solar battery strings is detected, the second switch of the one of the solar battery strings is shifted to an open state immediately, and thereafter the first switch of the one of the each solar battery strings is shifted to an open state.

* * * * *